(12) United States Patent
Takehara et al.

(10) Patent No.: US 7,960,271 B2
(45) Date of Patent: Jun. 14, 2011

(54) SEMICONDUCTOR DEVICE AND METHOD OF MANUFACTURING THE SAME

(75) Inventors: Hideki Takehara, Hyogo (JP); Yoshihiro Tomita, Osaka (JP); Seiji Fujiwara, Kyoto (JP); Takahiro Nakano, Kyoto (JP); Hikari Sano, Hyogo (JP)

(73) Assignee: Panasonic Corporation, Osaka (JP)

( * ) Notice: Subject to any disclaimer, the term of this patent is extended or adjusted under 35 U.S.C. 154(b) by 421 days.

(21) Appl. No.: 12/203,982

(22) Filed: Sep. 4, 2008

(65) Prior Publication Data
US 2009/0065933 A1    Mar. 12, 2009

(30) Foreign Application Priority Data
Sep. 7, 2007   (JP) ................................. 2007-232115

(51) Int. Cl.
*H01L 21/44* (2006.01)
*H01L 23/48* (2006.01)

(52) U.S. Cl. ........................................ 438/612; 257/738
(58) Field of Classification Search .......... 438/612–618, 438/108, 665; 257/738, E21.508
See application file for complete search history.

(56) References Cited

U.S. PATENT DOCUMENTS

| | | | |
|---|---|---|---|
| 6,372,622 B1 | 4/2002 | Tan et al. | 438/612 |
| 6,426,281 B1 * | 7/2002 | Lin et al. | 438/612 |
| 6,756,294 B1 * | 6/2004 | Chen et al. | 438/612 |
| 2006/0189114 A1 | 8/2006 | Seto et al. | 438/597 |

FOREIGN PATENT DOCUMENTS
JP    10-41307    2/1998

* cited by examiner

*Primary Examiner* — Calvin Lee
(74) *Attorney, Agent, or Firm* — Steptoe & Johnson LLP

(57) ABSTRACT

The present invention provides a semiconductor device that can suppresses poor connection caused by the variation of the heights of bumps during reflow heating, can be applied to a narrow array pitch, and can freely adjust the heights of the bumps.

10 Claims, 11 Drawing Sheets

SEMICONDUCTOR DEVICE AND METHOD OF MANUFACTURING THE SAME

FIELD OF THE INVENTION

The present invention relates to a semiconductor device and a method of manufacturing the same. More specifically, the present invention relates to a technique for forming a circuit pattern on a substrate composed of one of silicon and gallium arsenide, forming underlying electrodes on the opening of an insulating film, and forming solder protruded electrodes thereon.

BACKGROUND OF THE INVENTION

In recent years, demands for down-sizing and thickness reduction of semiconductor devices for communications have been increasing in the field of mobile communications with a focus on mobile phones. In mobile phones, with the improvement of functions, space for mounting semiconductor devices for communications has been narrowed. Thus, in place of a configuration in which packaged semiconductor devices are mounted on a substrate, the number of cases where a bare chip having protruded electrodes (hereafter referred to as "solder bumps") is directly mounted on a substrate has been increased.

Furthermore, reducing the size of a semiconductor device with semiconductor elements mounted thereon to be smaller than 0603 size (0.6 mm length×0.3 mm width×0.3 mm height), which is the size of a chip-type passive part, has been studied.

In such a semiconductor device having a height of not more than 0.3 mm, heights of solder bumps often become not more than 100 μm, i.e. micro bumps in many cases, and as a result of using bare chips, the pitch between the bumps becomes nearly 200 μm and the bumps mutually come close. Furthermore, since a receiving land provided on a mounting board is 100 μm or less square, solder printing on the receiving land of the mounting board is difficult.

Since the diameter of the micro bump is small, the quantity of solder decreases, and since the bump pitch between the micro bumps is narrowed, the area of the receiving land of the mounting board is reduced. For these reasons, when a bare chip having micro bumps is mounted on a board, soldering mounting is often used in which only flux is applied to the mounting board to mount the bare chip and reflow heating is performed.

At the same time, if the heights of solder bumps vary, disadvantageously, defective soldering is likely to occur. Specifically, if there is a portion where the solder bumps do not contact the receiving land of the mounting board due to the variation of the heights of the solder bumps, even if reflow heating is performed, heat is not sufficiently transferred to the solder bumps separated from the receiving land of the mounting board. Therefore, solder may not be melted to cause poor characteristics, and the shape of the solder may be deformed to cause poor appearance.

FIG. 12 is a sectional view showing the configuration of a conventional semiconductor device (bare chip). The semiconductor device shown in FIG. 12 is 4 mm square, and has the total thickness of 0.3 mm including the height of a solder bump. On the surface layer of a wafer of a substrate 51, 56 connecting pads 54 are formed in 0.25 mm pitch along the periphery of the chip. On the surface layer of the wafer of the substrate 51, a thin insulating protective film 55 is also formed so that the surfaces of the connecting pads 54 are exposed.

An underlying electrode 56 is formed on each of the connecting pads 54, and a solder bump 52 composed of SnAg having a height of 90 μm is formed by plating on each underlying electrode 56. In ordinary plating processes, after forming underlying electrodes 56, a plating resist is applied, openings for the underlying electrodes are formed by exposure, and SnAg solder bumps 52 are formed by electrolytic plating. Then, after removing the plating resist film, reflow heating is performed to process the solder bumps 52 to be spherical.

However, since solder bumps are formed by a plating process, the above-described semiconductor device has a problem of the variation in the height of bumps, and the variation in the height of the completed bumps tends to be large as the plating resist film is thicker. For example, when the target value of the height of the completed bumps is 30 μm, the tolerance becomes about 3 μm; when the target value of the height of the completed bumps is 50 μm, the tolerance becomes about 10 μm; and when the target value of the height of the completed bumps is 90 μm, the tolerance becomes about 15 μm; and the tolerance increases with an increase in the target value.

When such semiconductor devices are mounted on the receiving land of the mounting board, the solder bumps support the semiconductor devices on the mounting board. Therefore, the distance between the substrate of the semiconductor device and the mounting board is determined at a portion of the solder bump having a large height, and the solder bumps having a small height are in a state where the solder bumps do not reach the receiving land of the mounting board and are isolated from the receiving land. Such a state is easily produced as the target value of the height of completed bumps is larger, and further the number of solder bumps increases.

With solder bumps having a height of not more than 100 μm, the receiving land of the mounting board is too small to perform solder printing. Therefore, since heat is not transferred if reflow heating is performed in the state where the solder bumps are isolated from the receiving land, disadvantageously, solder is not melted to cause defective connection, and only a part of solder bumps are melted to make the bump shape abnormal.

It is an object of the present invention to provide a semiconductor device and a method of manufacturing the same that can realize the stable yield of solder connection even if the height of solder bumps varies, with the configuration of the solder bumps capable of absorbing the variation of the height of the bumps during reflowing in mounting the semiconductor device on a mounting board.

DISCLOSURE OF THE INVENTION

In order to solve the above-described problems, a semiconductor device according to the present invention includes a circuit pattern formed on a semiconductor substrate; an insulating protective film formed on the circuit pattern; underlying electrodes connected to the circuit pattern formed in the opening of the insulating protective film; and solder protruded electrodes formed on the underlying electrodes, wherein the solder protruded electrodes have a plate-like shape of a predetermined thickness extended from the underlying electrodes onto the insulating protective film, and the area of each of the solder protruded electrodes formed is wider than the area of each of the underlying electrodes.

In the semiconductor device according to the present invention, each of the solder protruded electrodes contains a predetermined quantity of solder in a region extended from the underlying electrodes along the insulating protective film, and the predetermined quantity of the solder is a quantity required so that the height of each of the solder protruded electrodes after reflowing increases to at least a tolerance for the height of each of the solder protruded electrodes before reflowing.

In the semiconductor device according to the present invention, each of the solder protruded electrodes has a plate-like shape that satisfies:

$$(Sb-Sm)/Sm > \Delta Hb/Hb$$

where Sb is the area, Hb is the thickness, and $\Delta Hb$ is the variation width of the height of each of the solder protruded electrodes; and Sm is the area of each of the underlying electrodes.

In the semiconductor device according to the present invention, each of the solder protruded electrodes has a plate-like shape whose upper surface is one of triangular, rectangular and elliptical, extending toward at least one direction along the insulating protective film.

The semiconductor device according to the present invention has the plurality of solder protruded electrodes arrayed in line, wherein each of the solder protruded electrodes has a plate-like shape whose upper surface is rectangular, not extending toward a direction facing the adjacent solder protruded electrodes and having the same width as the width of each of the underlying electrodes, and extending toward a direction perpendicular to the array direction of the solder protruded electrodes along the insulating protective film.

The semiconductor device according to the present invention has the plurality of solder protruded electrodes arrayed in two lines, wherein each of the solder protruded electrodes has a plate-like shape whose upper surface is triangular, and between the adjoining apexes of the solder protruded electrodes in one of the lines, the apex of the one solder protruded electrode in the other line is positioned.

In the semiconductor device according to the present invention, each of the solder protruded electrodes has a plate-like shape whose upper surface is rectangular, and has a dent in the corresponding region on each of the underlying electrodes on the upper surface.

In the semiconductor device according to the present invention, the semiconductor substrate is composed of one of silicon and gallium arsenide.

A method of manufacturing a semiconductor device according to the present invention includes the steps of: forming a circuit pattern on a semiconductor substrate, forming an insulating protective film on the circuit pattern, forming underlying electrodes connected to the circuit pattern in the opening of the insulating protective film, and forming solder protruded electrodes on the underlying electrodes, wherein the solder protruded electrodes are formed in a plate-like shape having a predetermined thickness and in a region extended from the underlying electrodes along the insulating protective film so as to contain a predetermined quantity of solder, and the predetermined quantity of the solder is a quantity required to increase the height of each of the solder protruded electrodes that are spherically deformed on the underlying electrodes when the solder is melted by reflow heating to at least a tolerance for the height of each of the solder protruded electrodes before reflowing.

In the method of manufacturing a semiconductor device according to the present invention, when the solder protruded electrodes are formed on the underlying electrodes, a first resist film is formed so as to expose all the underlying electrodes on the same surface, a second resist film having openings each larger than one of the underlying electrodes on the first resist film, the solder protruded electrodes are formed by plating in the opening of the second resist film, thereafter, the first and second resist films are removed to form the solder protruded electrodes extended from the underlying electrodes along the insulating protective film.

In the method of manufacturing a semiconductor device according to the present invention, when the solder protruded electrodes are formed on the underlying electrodes, a vapor-deposited amphoteric metal layer is formed in the peripheral region of the underlying electrodes so as to expose the underlying electrodes, a resist film having an opening larger than the underlying electrodes is formed thereon, the solder protruded electrodes are formed in the opening of the resist film by plating, thereafter, the resist film is removed, and the vapor-deposited amphoteric metal layer is removed using an alkaline chemical solution to form the solder protruded electrodes extended from the underlying electrodes along the insulating protective film.

According to the present invention, since the height of the solder protruded electrode after reflow heating increases to more than the tolerance for the height of the solder protruded electrode before reflowing so that the solder protruded electrode contacts the receiving land of the mounting board, defective soldering during reflowing can be suppressed.

As a secondary effect, since the distance between the semiconductor device and the mounting board after reflow heating is widened, cleaning characteristics in flux cleaning are improved, and a gap can be easily sealed by an under-fill resin.

According to the present invention, since the solder protruded electrode has a shape not extended in the direction facing the adjoining solder protruded electrodes, having the same width as the underlying electrode, but extended in the direction perpendicular to the array direction of the solder protruded electrodes along the insulating protective film, and the quantity of solder can be freely adjusted without widening the pitch distance to the adjoining solder protruded electrodes, defective soldering in a narrow array pitch during reflowing can be suppressed.

According to the present invention, since the height of the solder protruded electrode after reflow heating can be freely adjusted by adjusting the size of the region extended along the insulating protective film of the solder protruded electrode, defective soldering can be more reliably suppressed by the height-elevating effect of the solder protruded electrode when solder is melted.

According to the present invention, since the plurality of solder protruded electrodes are provided with the array pitch narrowed as a whole, by disposing the solder protruded electrodes having a triangular plate-like shape in two rows, and by positioning one of the apexes of the solder protruded electrodes in one of the rows between the apexes of two adjacent solder protruded electrodes in the other row, the array distance of the solder protruded electrodes can be narrowed compared with the case where the solder protruded electrodes are linearly disposed in one row.

Also according to the present invention, the quantity of solder in the solder protruded electrodes can be delicately adjusted by forming dents on surfaces of the solder protruded electrodes. Furthermore, when the semiconductor device is electrically tested, the stable tests of the solder protruded electrodes can be conducted by inserting a probe having a spherical tip into the dents.

DESCRIPTION OF THE EMBODIMENTS

Figure 1A:
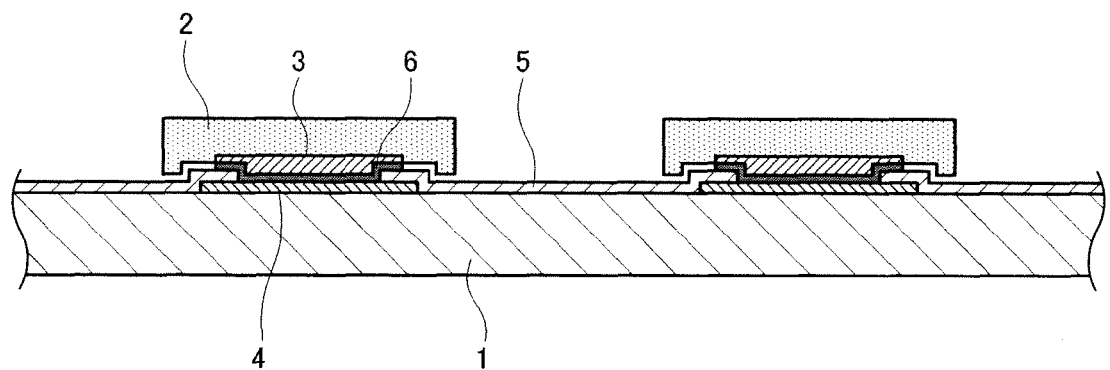
FIG. 1A is a sectional view showing the configuration of a semiconductor device according to a first embodiment of the present invention.

Embodiments illustrating a semiconductor device of the present invention and a method of manufacturing the same will be described hereunder referring to the drawings.

First Embodiment

Figure 1B:
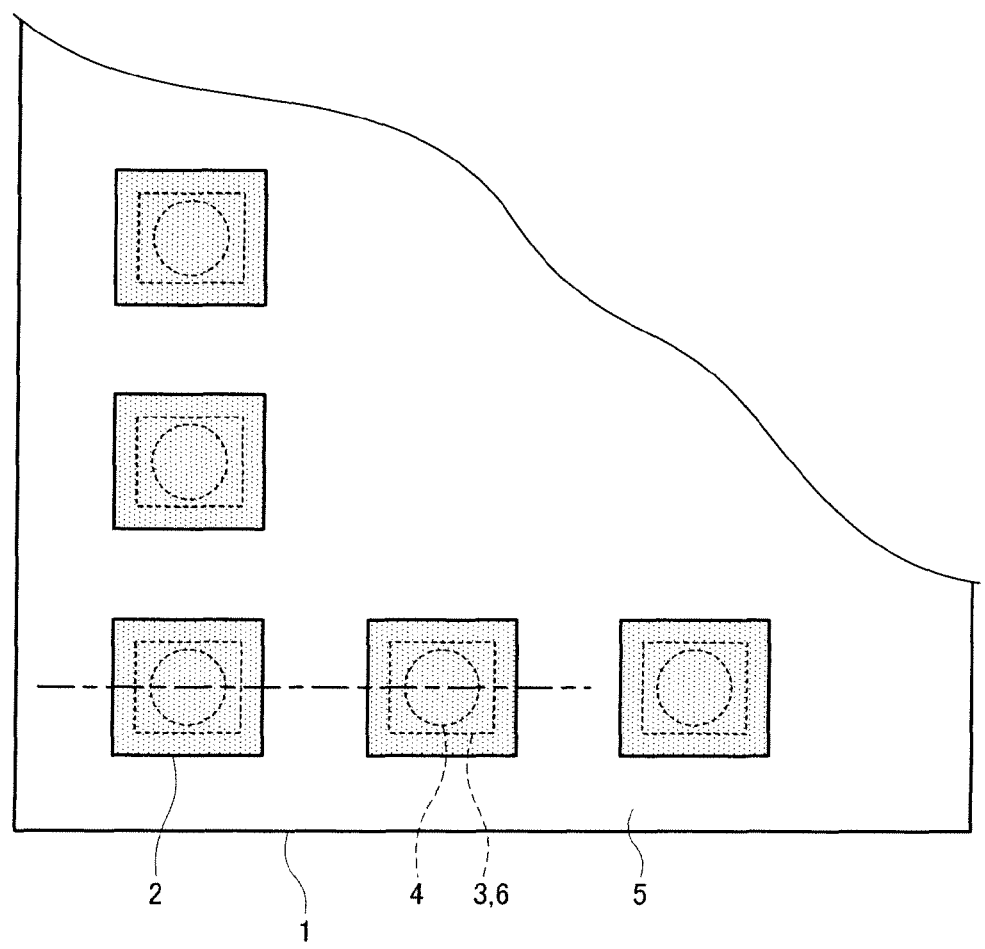
FIG. 1B is a plan view showing the configuration of the semiconductor device according to the first embodiment of the present invention.
Figure 2A:
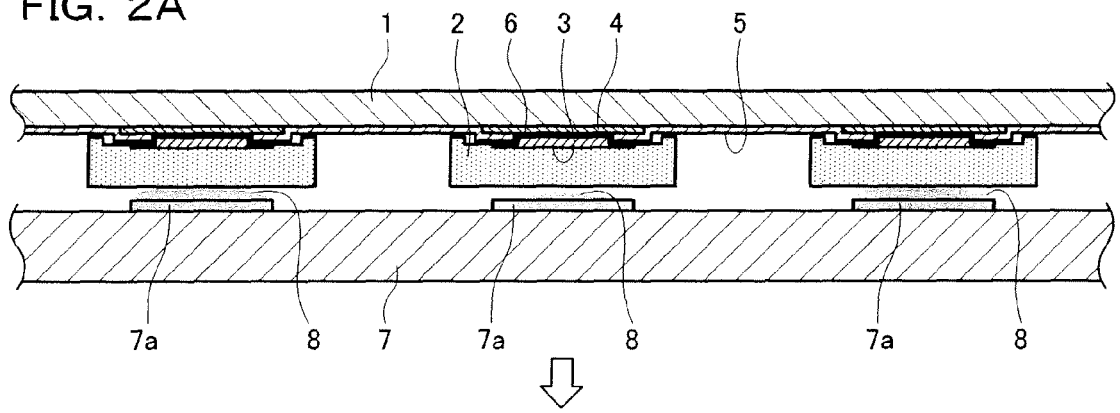
FIGS. 2A to 2C are schematic diagrams showing the appearances when the semiconductor device is mounted on a mounting board in the first embodiment of the present invention.
Figure 2B:
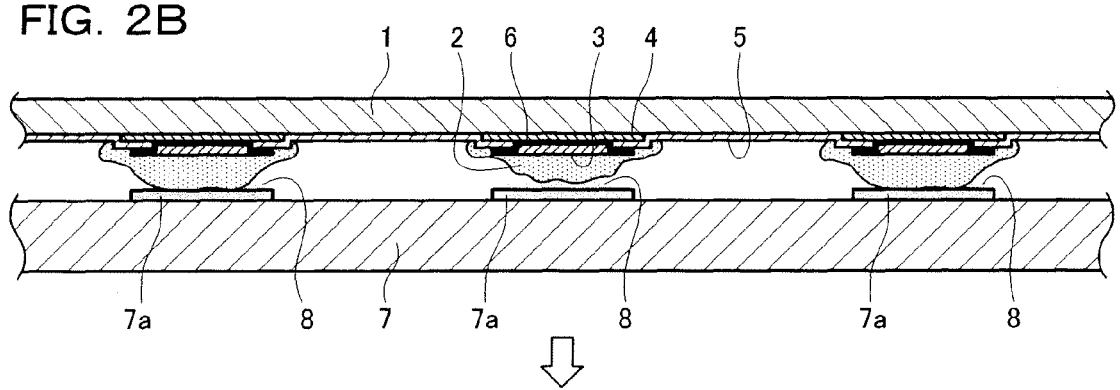
Figure 2C:
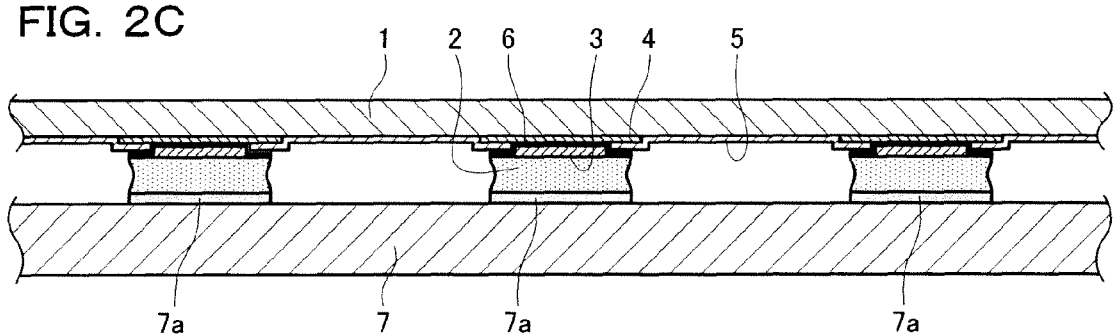

FIGS. 1A and 1B show the configuration of a semiconductor device (bare chip) according to the first embodiment; FIG. 1A is a plan view of an antenna switch element for 2 GHz W-CDMA composing the semiconductor device, and FIG. 1B is a sectional view of the semiconductor device. FIGS. 2A to 2C are schematic diagrams showing the appearances when the semiconductor device is mounted on a mounting board.

The dimension of the antenna switch element is a length of 2 mm and a width of 2 mm; and the total thickness including the bump height is 0.3 mm. A substrate 1 is a GaAs wafer having a thickness of 0.2 mm, and on the surface layer of the wafer, an antenna switch circuit pattern (not shown) is formed.

On the surface layer of the substrate 1, a plurality of connecting pads 4 and a thin insulating protective film 5 are formed, and in windows having a predetermined aperture of the insulating protective film 5, the connecting pads 4 are exposed. Here, 56 connecting pads 4 exposed in windows each having a diameter of 80 μm are formed at 250 μm pitch along the periphery of the substrate 1. The material of the connecting pads 4 is gold.

Underlying electrodes 6 are formed on the connecting pads 4, and solder bumps (solder protruded electrodes) 2 are formed on the underlying electrodes 6. The purpose of forming the underlying electrodes 6 is to suppress the interdiffusion of metals between the connecting pads 4 and the solder bumps (solder protruded electrodes) 2; and requirements for the underlying electrodes 6 are as follows:

1. High adhesiveness to metal of connecting pads;
2. Low connecting resistance;
3. To be barriers so that metal of connecting pads does not contact solder bumps;
4. To get wet with solder; and
5. To be able to be formed also on probed connecting pads.

For the above-described reasons, a plurality of metals are often combined for the underlying electrodes 6. In the examples shown in FIGS. 1A and 1B, a two-layered vapor-deposited layer of titanium (Ti) and copper (Cu) is formed. The dimension of the underlying electrode 6 is often around 1.2 times the dimension of a later described plating mask considering displacement, and here, the dimension of the underlying electrode 6 is 100 μm square.

Furthermore, between the vapor deposited layers of the underlying electrodes 6 and the solder bumps 2, nickel (Ni) layers 3, which are part of the underlying electrodes 6, are formed by plating, and the solder bumps 2 of SnAg composition are formed by plating to suppress the interdiffusion of both metals.

Each of the solder bumps 2 is plate-shaped with a square upper surface, the dimension of the solder bump is 150 μm square and the height is 30 μm, and the solder bump extends by 25 μm from the underlying electrode 6 toward four directions perpendicular to each side of the solder bump with the underlying electrode 6 as a center along the film surface of the insulating protective film 5. Since the solder bumps 2 are formed by plating, the solder bumps 2 have the advantage that the shape of the bumps can be designed freely, and for example, the shape can be triangular or elliptical.

As shown in FIGS. 2A to 2C, when the semiconductor device having solder bumps 2 (bare chip) is mounted on a mounting board 7, a solder flux 8 is previously applied on the receiving land of the mounting board 7. The semiconductor device is placed on the solder flux 8 with the surface on which the solder bumps 2 are provided facing down using an apparatus such as a chip mounter, and the solder bumps 2 are heated and melted in a reflow furnace.

If solder bumps 2 having a bump height of up to 100 μm are placed at a bump pitch (array pitch) of up to 250 μm, the size of the receiving land of the mounting board becomes about 100 μm square, and applying with an ordinary solder printing method becomes difficult. Therefore, as described above, only the solder flux 8 is applied onto the mounting board side, and then the solder bumps 2 formed on the semiconductor device are used for connection in many cases.

As described above, heretofore, defective soldering has been disadvantageously often caused if the heights of bumps vary.

Figure 3A:
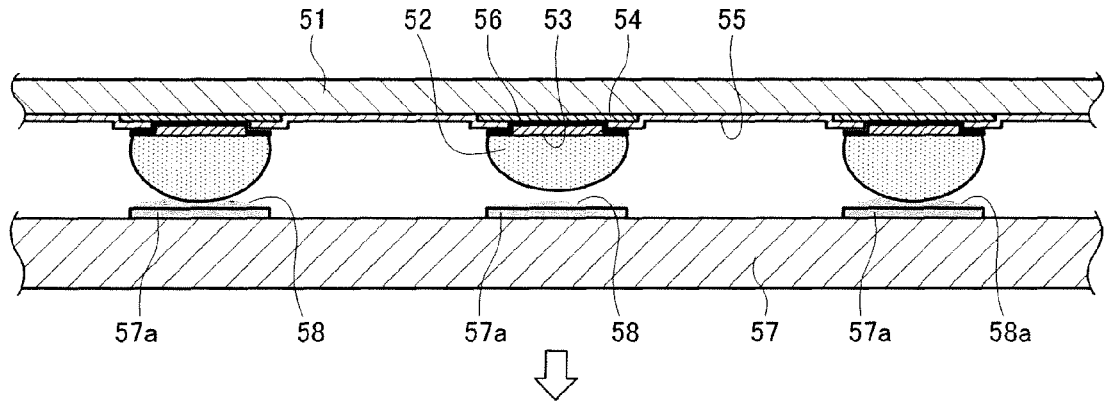
FIGS. 3A to 3C are schematic diagrams showing the appearances when a conventional semiconductor device is mounted on a mounting board.

Specifically, as shown in FIG. 3A, solder bumps 52 having a large bump height, that is, right and left bumps in FIG. 3A contact receiving lands 57a on a mounting board 57 via a solder flux 58 from the initial stage of mounting.

Figure 3B:
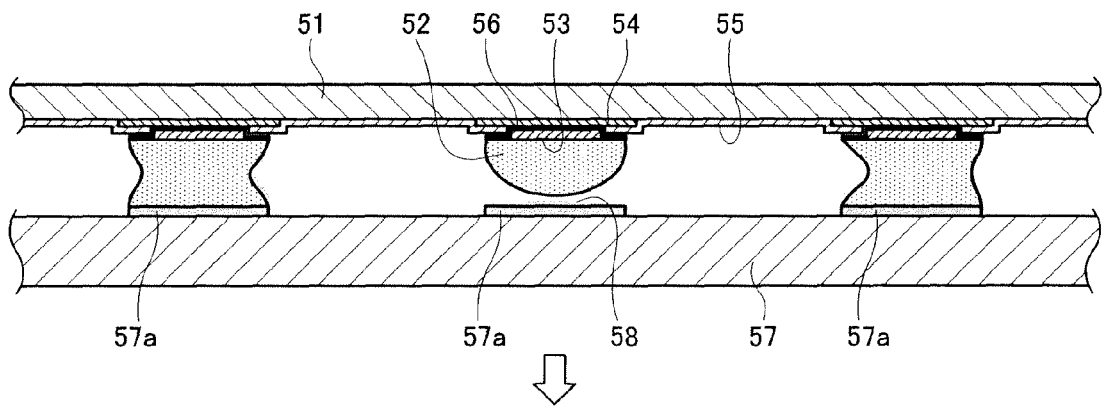

When the solder is heated and melted in the reflow furnace, as shown in FIG. 3B, the solder activated by the solder flux 58 wets and spreads in the receiving lands on the mounting board 57 to complete soldering.

Figure 3C:
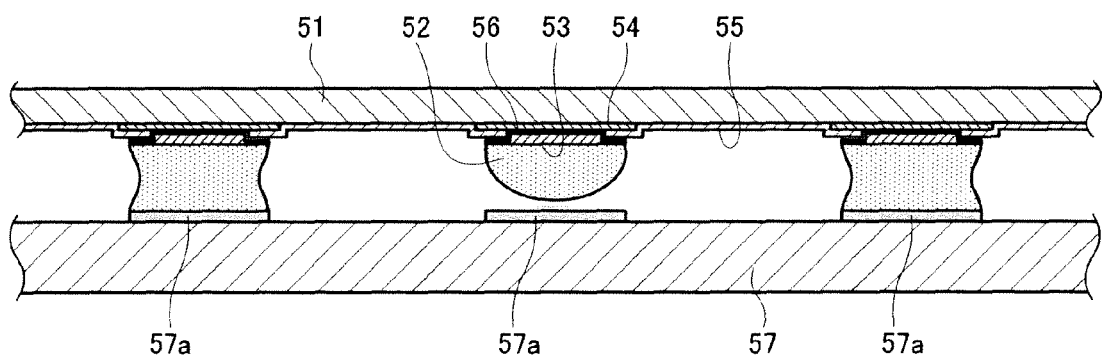

At that time, as shown in FIG. 3C, the semiconductor device slightly sinks toward the mounting board 57. However, in the solder bump 52 separated from the receiving land 57A of the mounting board 57 and the solder flux 58 due to the variation of the heights of the bumps, that is, the solder bump 52 at the center in FIG. 3C, the melted solder does not reach the receiving land 57a of the mounting board 57, defective soldering easily occurs.

On the other hand, in the semiconductor device according to the first embodiment, as shown in FIG. 2A, when the semiconductor device is placed on the mounting board 7, and the solder bumps 2 are heated and melted in the reflow furnace, the molten solder gathers on the underlying electrodes 6 as shown in FIG. 2B, and the height of the solder bumps 2 increases by about 40 μm.

When the process further proceeds, the solder bumps 2 that contact a receiving land 7a of the mounting board 7 via the solder flux 8 in the initial stage of mounting, that is, the right and left bumps in FIG. 2A, are melted and spread on the receiving land 7a of the mounting board 7 as shown in FIG. 2C.

As shown in FIG. 2B, the height of the solder bump 2 that does not contact the receiving land 7a of the mounting board 7 and the flux 8 in the initial stage of mounting, that is, the solder bump 2 at the center in FIG. 2B, increases by about 40 mm, which is more than the tolerance of the bump height before reflowing (for example, 6 μm at ±3 μm, 20 μm at ±10 μm, and 30 μm at ±15 μm), and the molten solder bump 2 contacts the receiving land of the mounting board. Thereafter, as shown in FIG. 2C, the molten solder bump 2 spreads on the receiving land of the mounting board 7.

Furthermore, since force is applied downward to the semiconductor device when the solder bumps 2 are melted, the downward force brings about a synergistic effect to make the solder bumps 2 approach the receiving land 7a, and defective soldering can be markedly reduced. In the first embodiment, although the shape of the solder is square as shown in FIG. 1B, the equivalent effect can be obtained when the shape is triangular or elliptical.

Figure 10A:
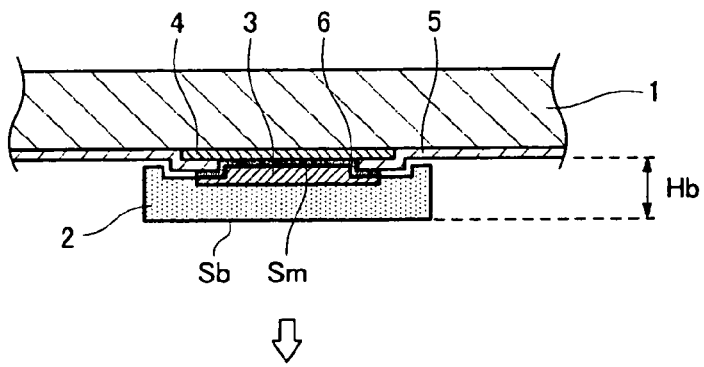
FIG. 10A is a sectional view showing a solder bump before reflowing according to the first embodiment of the present invention.
Figure 10B:
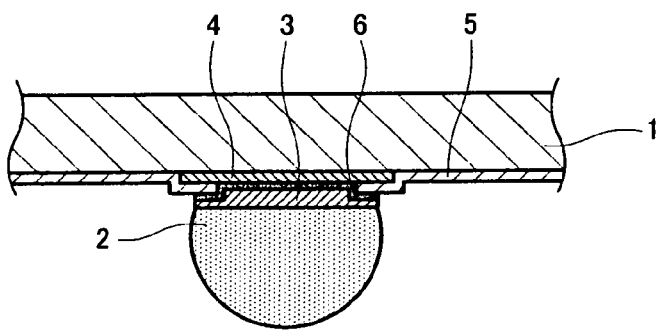
FIG. 10B is a sectional view showing the solder bump after reflowing according to the first embodiment of the present invention.

The conditions in which the height of the bumps is increased by melting of the solder bump 2 to more than the tolerance of variation as described above will be described referring to FIGS. 10A, 10B, 11A and 11B. FIGS. 10A and 10B are sectional views showing a case where the height of the bumps is effectively increased during reflowing; and FIGS. 11A and 11B are sectional views showing examples where the height of the bumps is not effectively increased during reflowing.

As shown in FIG. 10A, if the solder bump 2 before reflowing has a horizontally-spread shape than the underlying electrode 6, and the height of the solder bump is low, the effect that the molten solder gathers on the underlying electrode 6 effectively acts during reflowing as shown in FIG. 10B.

Figure 11A:
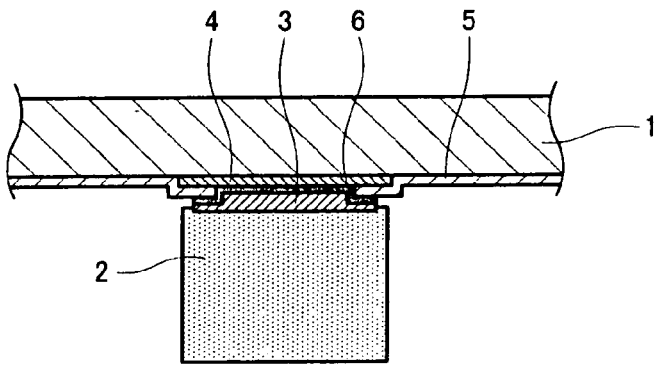
FIG. 11A is a sectional view showing a solder bump before reflowing in an example in which bump height is not effectively increased during reflowing.
Figure 11B:
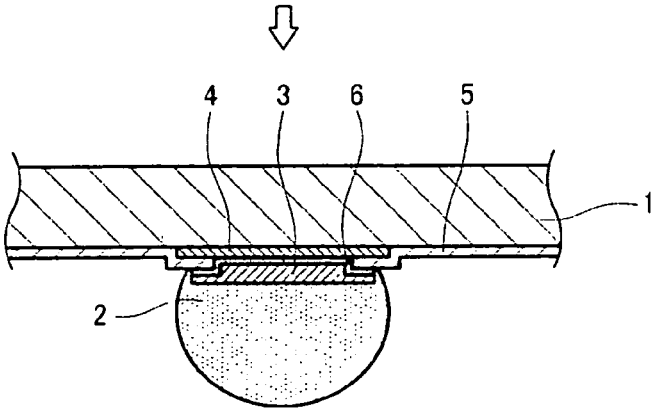
FIG. 11B is a sectional view showing the solder bump after reflowing in an example in which the bump height is not effectively increased during reflowing.
Figure 12:
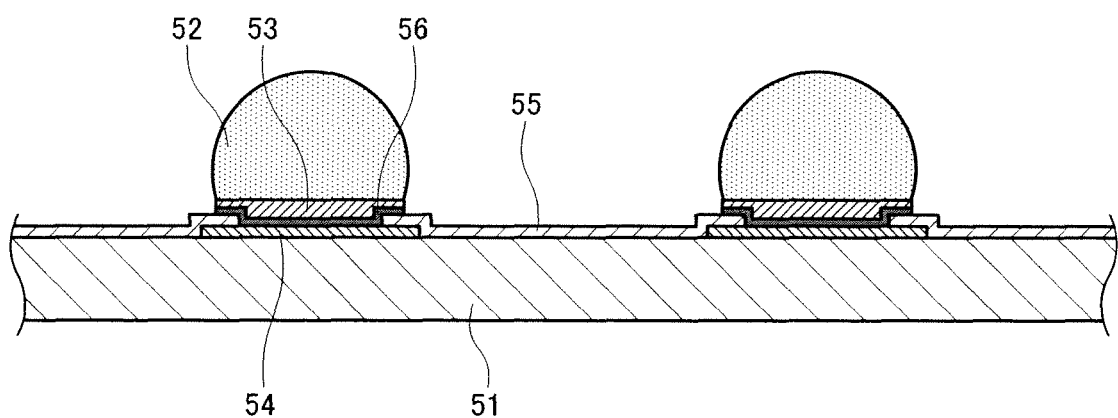
FIG. 12 is a sectional view showing the configuration of a conventional semiconductor device.

As shown in FIG. 11A, if the solder bump 2 before reflowing has substantially the same horizontal shape as the underlying electrode 6, and the height of the solder bump is large from the initial stage, the effect that the molten solder gathers on the underlying electrode 6 is small during reflowing as shown in FIG. 11B, and on the contrary, the height of the solder bump may be even lowered by reflowing.

Therefore, when the quantity of solder in the region outwardly extending from the underlying electrode 6 along the insulating protective film 5, that is, in the region running off the edge of the underlying electrode 6, is small before reflowing, the effect that the solder gathers onto the underlying electrode 6 from the outside of the underlying electrode 6 cannot be achieved during reflowing.

In addition, in the region running off the edge of the underlying electrode 6, a sufficient run-off area is required. Specifically, the relationship of the following formula must be satisfied:

$$(Sb-Sm)/Sm > \Delta Hb/Hb$$

where Sb is the area, Hb is the thickness, and ΔHb is the variation width of the height of each of the solder bumps 2; and Sm is the area of each of the underlying electrodes 6.

Second Embodiment

FIGS. 4A to 4H are schematic diagrams showing a first method of manufacturing a semiconductor device as the second embodiment.

Figure 4A:
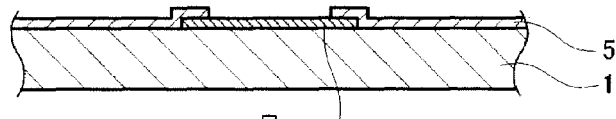
FIGS. 4A to 4H are schematic diagrams showing a first method of manufacturing a semiconductor device as a second embodiment.

As shown in FIG. 4A, on a substrate 1 on which connecting pads 4 are formed, a thin insulating protective film 5 is formed on the wafer surface layer of the substrate 1 so as to expose the surface of the connecting pads 4.

Figure 4B:

Next, as shown in FIG. 4B, vapor deposited layers of underlying electrodes 6 composed of Ti and Cu are formed on the connecting pads 4 and the insulating protective film 5.

Figure 4C:
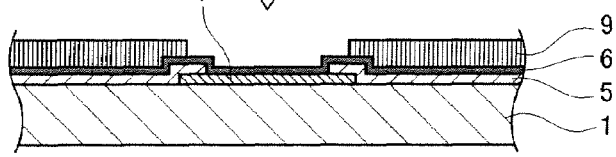

Next, as shown in FIG. 4C, a first plating resist film 9 is formed so as to have the same thickness as a desired Ni layer, and an exposure process is performed to form openings on the underlying electrodes 6.

Figure 4D:
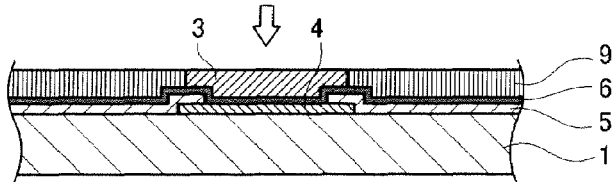

Next, as shown in FIG. 4D, a Ni layer 3 of the same thickness as the first plating resist film 9 is applied in each opening.

Figure 4E:
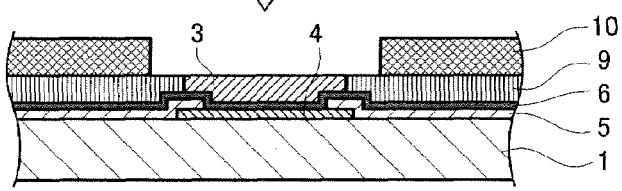

Next, as shown in FIG. 4E, a second plating resist film 10 is formed on the first plating resist film 9, openings larger than the underlying electrodes 6 are formed in the positions corresponding to the underlying electrodes 6.

Figure 4F:
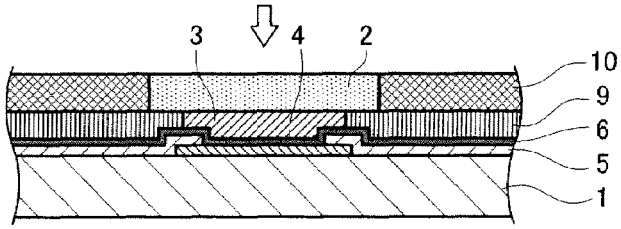

Next, as shown in FIG. 4F, a SnAg-based solder (solder bump 2) is formed on the Ni layer 3 in each opening using a plating process. The thickness of the first plating resist film 9 is 10 μm, and the thickness of the second plating resist film 10 is 30 μm.

Figure 4G:
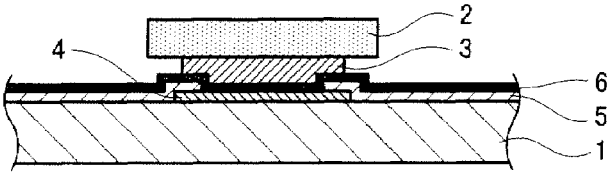

Next, as shown in FIG. 4G, after forming the solder bumps, the second plating resist film 10 and the first plating resist film 9 are simultaneously removed.

Figure 4H:
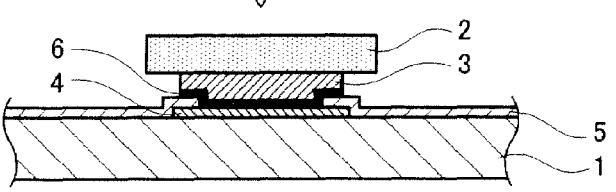

Finally, as shown in FIG. 4H, the metal of the underlying electrodes 6 in the unnecessary region on the insulating protective film 5 is removed. Through the above-described processes, the solder bumps 2 extending in a direction perpendicular to each side of the underlying electrodes 6 are formed along the film surface of the insulating protective film 5.

Third Embodiment

FIGS. 5A to 5H and FIGS. 6A to 6F show a second method of manufacturing a semiconductor device as the third embodiment.

Figure 5A:
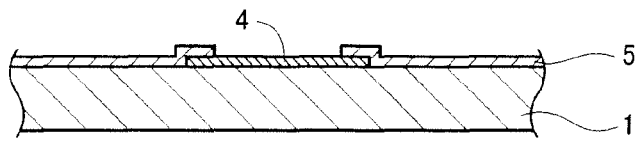
FIGS. 5A to 5H are schematic diagrams showing a second method of manufacturing a semiconductor device as a third embodiment.

As shown in FIG. 5A, on a substrate 1 on which connecting pads 4 are formed, a thin insulating protective film 5 is formed on the wafer surface layer of the substrate 1 so as to expose the surface of the connecting pads 4.

Figure 5B:
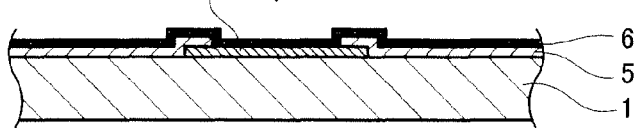

Next, as shown in FIG. 5B, vapor deposited layers of underlying electrodes 6 composed of Ti and Cu are formed on the connecting pads 4 and the insulating protective film 5.

Figure 5C:
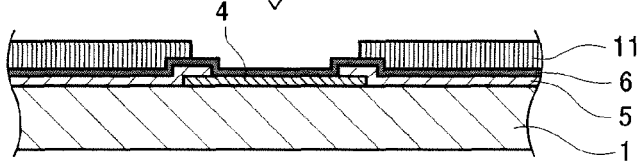

Next, as shown in FIG. 5C, a first plating resist film 11 is formed so as to have the same thickness as a desired Ni layer, and an exposure process is performed to form openings on the underlying electrodes 6.

Figure 5D:
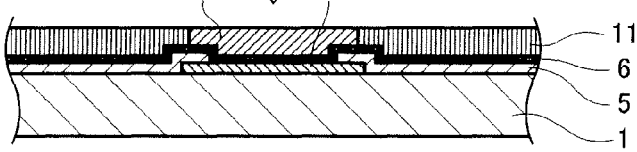

Next, as shown in FIG. 5D, a Ni layer 3 of the same thickness as the first plating resist film 11 is formed in each opening.

Figure 5E:
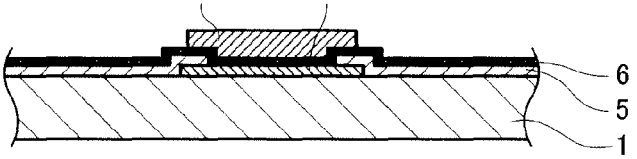

Next, as shown in FIG. 5E, the first plating resist film 11 is removed.

Figure 5F:
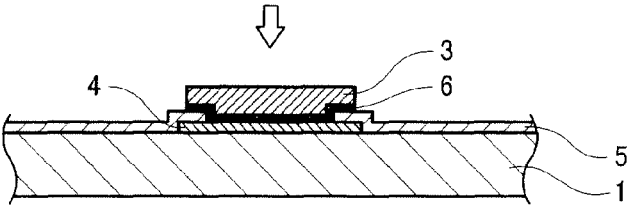

Next, as shown in FIG. 5F, the underlying electrodes 6 in the unnecessary region is removed.

Figure 5G:
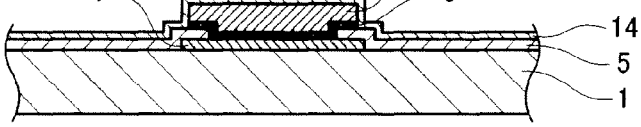

Next, as shown in FIG. 5G, a thin Al film 14 coating the insulating protective film 5 and the Ni layer 3 and functioning as a vapor-deposited amphoteric metal layer is formed using vapor deposition.

Figure 5H:
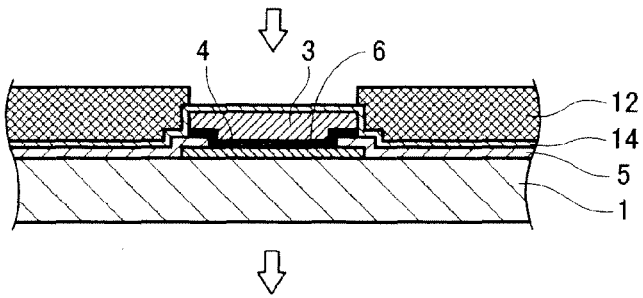

Next, as shown in FIG. 5H, a second plating resist film 12 of a predetermined thickness is applied over the thin Al film 14, and an exposure process is performed to form openings of the same size as the underlying electrodes 6 in the positions of the underlying electrodes 6.

Figure 6A:
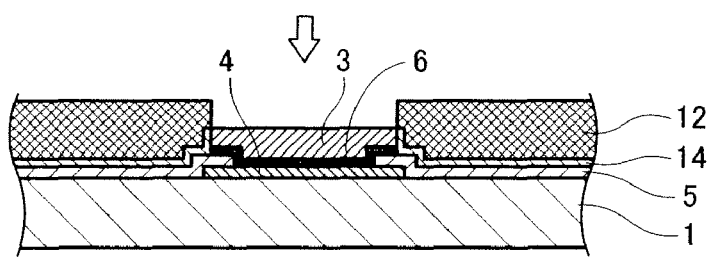
FIGS. 6A to 6F are schematic diagrams showing a second method of manufacturing a semiconductor device as the third embodiment.

Next, as shown in FIG. 6A, the thin Al film 14 exposed in the openings of the resist film using an alkaline aqueous solution, such as sodium hydroxide, is removed.

Figure 6B:
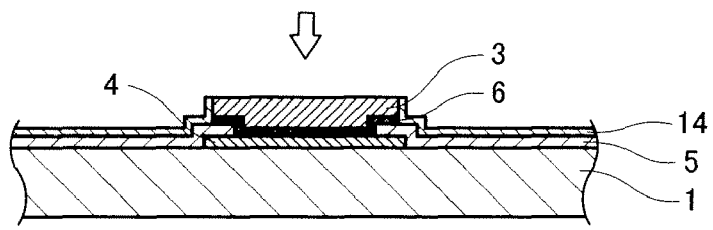

Next, as shown in FIG. 6B, the second plating resist film 12 is removed.

Figure 6C:
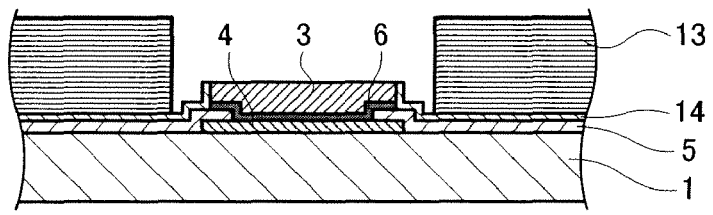

Next, as shown in FIG. 6C, a third plating resist film 13 is formed on the thin Al film 14, and openings larger than the underlying electrodes 6 are formed.

Figure 6D:
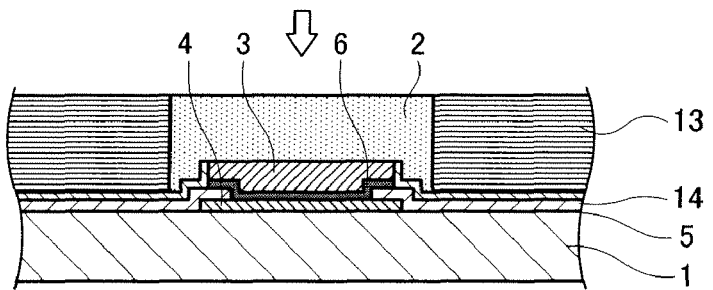

Next, as shown in FIG. 6D, a SnAg-based solder bump 2 is formed in each opening by plating. The thickness of the first plating resist film 11 is 10 μm, the thickness of the second plating resist film 12 is 15 μm and the thickness of the third plating resist film 13 is 30 μm.

Figure 6E:
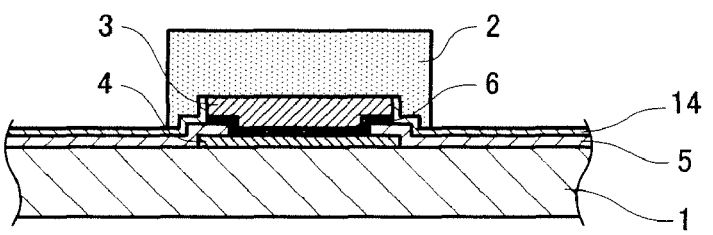

Next, as shown in FIG. 6E, the third plating resist film 13 is removed after forming the solder bumps.

Figure 6F:
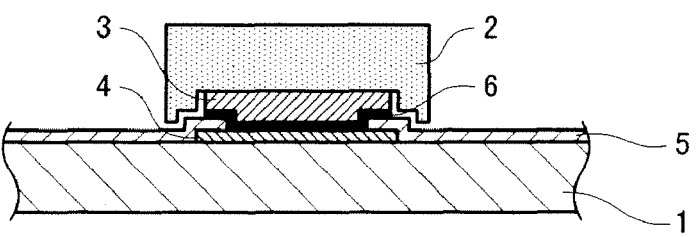

Next, as shown in FIG. 6F, the thin Al film 14 under the resist film 13 is removed using an alkaline aqueous solution, such as sodium hydroxide. Through the above-described processes, the solder bumps 2 extending in a direction perpendicular to each side of the underlying electrodes 6 are formed along the film surface of the insulating protective film 5.

Fourth Embodiment

Figure 7A:
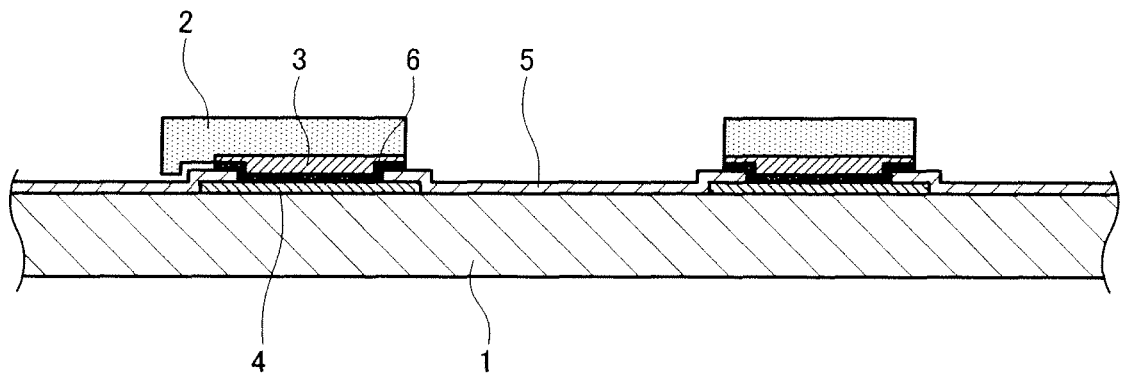
FIG. 7A is a sectional view showing the configuration of a semiconductor device according to a fifth embodiment of the present invention.
Figure 7B:
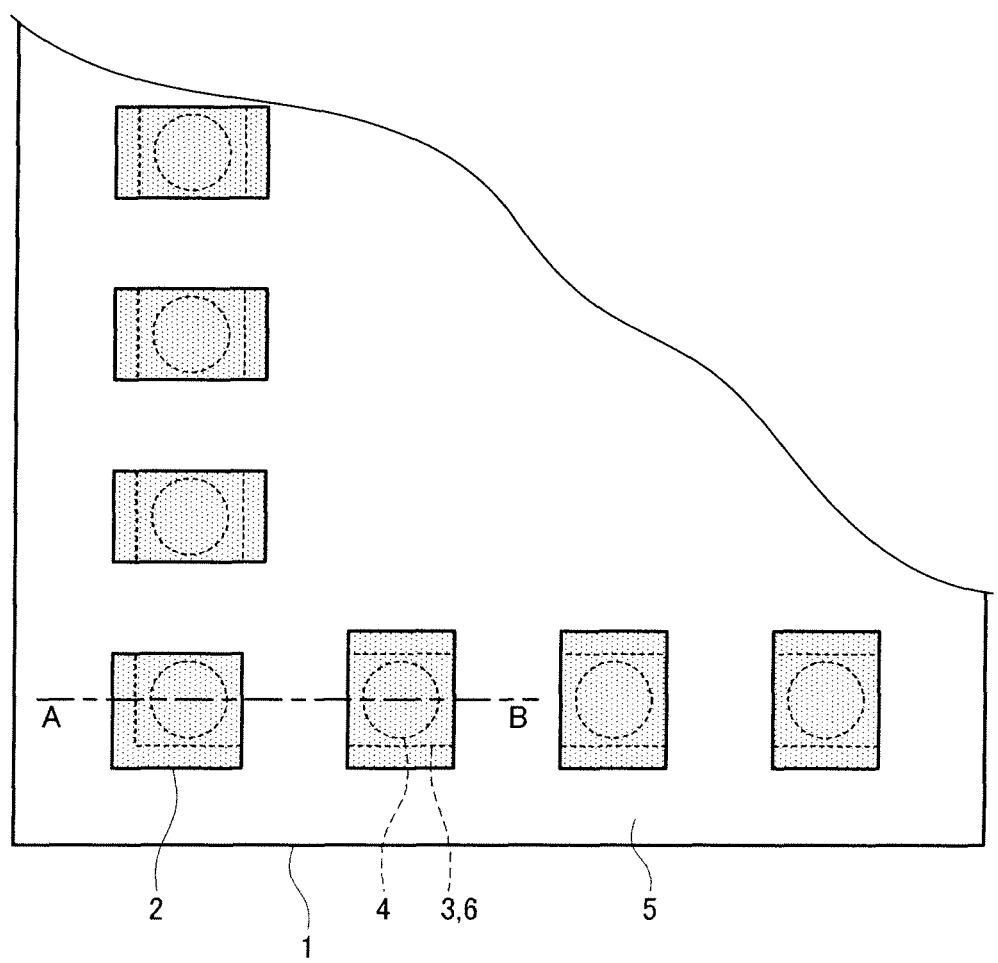
FIG. 7B is a plan view showing the configuration of a semiconductor device according to the fifth embodiment of the present invention.

FIGS. 7A and 7B are plan view and sectional view showing a semiconductor device according to the fourth embodiment, respectively. In FIGS. 7A and 7B, the dimension of an antenna switch element composing the semiconductor device is 1.6 mm long and 1.6 mm wide; and the total thickness including the solder bump height is 0.3 mm. A substrate 1 is a GaAs wafer, and on the surface layer of the wafer, an antenna switch circuit pattern is formed. The thickness of the substrate 1 is 0.2 mm, and in windows having a predetermined aperture of an insulating protective film 5, connecting pads 4 are exposed. Here, 24 connecting pads 4 exposed in windows each having an aperture of 80 μm are formed at 200 μm pitch along the periphery of the substrate 1. The material of the connecting pads 4 is gold.

The shape and structure of an underlying electrode 6 are the same as in the semiconductor device in the first embodiment. Each of solder bumps 2 is plate-shaped with a square upper surface, and the dimension of the solder bump is 100 μm×300 μm and the height is 30 μm. Specifically, each solder bump 2 does not extend in a direction facing the adjoining solder bumps 2 and has the same width of 100 μm as the width of the underlying electrode 6, and the solder bump extends by 60 μm in each direction perpendicular to the array direction of the solder bumps 2 along the film surface of the insulating protective film 5 with the underlying electrode 6 as a center. The solder bumps 2 on the four corners have shapes extending in one or two directions from the underlying electrodes 6 toward a direction facing the periphery of the substrate 1.

With such a configuration, since the solder bumps 2 do not extend in the direction facing the adjoining solder bumps 2, short-circuiting is difficult to occur between the solder bumps 2 when solder is melted during reflowing, and the configuration can be applied to a narrow array pitch of 200 μm or less. Furthermore, in the same manner as is the previously described embodiments, by the solder-height increasing effect during reflowing, the effect of markedly reducing defective soldering in mounting to a mounting board 7 can be obtained.

Fifth Embodiment

A semiconductor device according to the fifth embodiment of the present invention will be described referring to FIGS. 1A and 1B, and FIGS. 4A to 4H. The semiconductor device according to the fifth embodiment is basically the same as the previously described first embodiment. Specifically, the size of an antenna switch element is 2 mm in length and 2 mm in width, and the total thickness including the height of a solder bump is 0.3 mm. A substrate 1 is a GaAs wafer, and an antenna switch circuit pattern is formed on the surface layer of the wafer.

The thickness of the substrate 1 is 0.2 mm, a plurality of connecting pads 4 and a thin insulating protective film 5 are formed in the wafer surface layer of the substrate 1, and the connecting pads 4 are exposed in windows having a predetermined aperture in the insulating protective film 5. Here, 56 connecting pads 4 exposed in windows each having an aperture of 80 μm are formed at 250 μm pitch along the periphery of the substrate 1. The material of the connecting pads 4 is gold.

On each of the connecting pads 4, a two-layered vapor-deposited layer of titanium (Ti) and copper (Cu) composing an underlying electrode 6 having a dimension of 100 μm square is formed. Furthermore, to suppress interdiffusion between the vapor-deposited layers of the underlying electrode 6 and the metal of solder bumps 2, nickel (Ni) layers 3 having the same dimensions as the underlying electrode 6 are formed by plating, and the solder bumps 2 of SnAg composition are formed by plating thereon.

In the fifth embodiment, through the advantage of forming the solder bumps 2 using a plating process, the volume of solder can be controlled by adjusting the area of the solder bumps 2 extending onto the insulating protective film 5 along the film surface thereof. By controlling the volume of the solder, the height of the solder bumps 2 after reflow heating can be freely controlled.

For example, when the solder bumps 2 have a plate-like shape with square upper surfaces, and the dimension of each solder bump 2 is 150 μm square and 30 μm high, the height of the hemispherical bump after reflowing increases to 70 μm. In the same manner, when each bump before reflowing is 175 μm square and 30 μm high, the height of the hemispherical bump after reflowing increases to 120 μm. Thus, the bump size can be advantageously designed regardless of the size of each of the underlying electrode 6, and in the same manner as in the previously described embodiments, by the solder-height increasing effect during reflowing, the effect of markedly reducing defective soldering in mounting to a mounting board 7 can be obtained.

Sixth Embodiment

Figure 8:
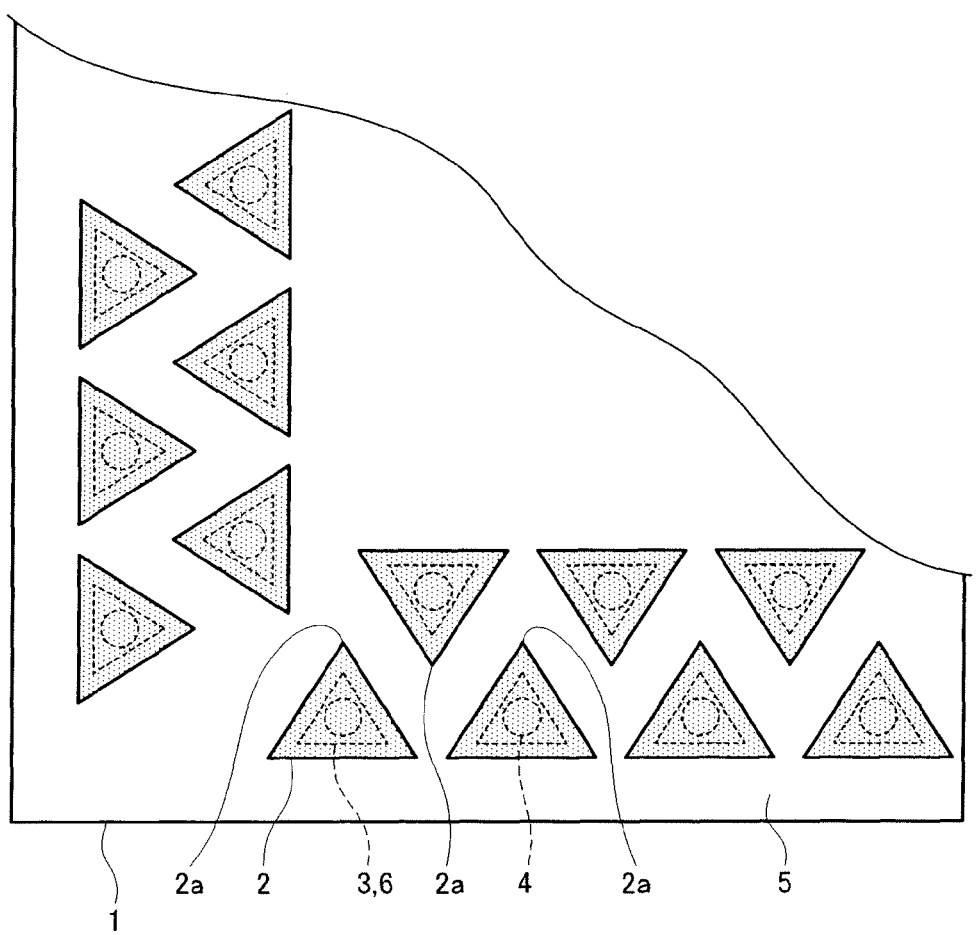
FIG. 8 is a plan view showing the configuration of a semiconductor device according to a sixth embodiment of the present invention.

FIG. 8 is a plan view showing a semiconductor device according to the sixth embodiment of the present invention. In FIG. 8, the size of an antenna switch element composing the semiconductor device is 1.6 mm long and 1.6 mm wide; and the total thickness including the height of a solder bump is 0.3 mm. A substrate 1 is a GaAs wafer and on the surface layer of the wafer, an antenna switch circuit pattern is formed.

The thickness of the substrate 1 is 0.2 mm, and connecting pads 4 are exposed in windows having a predetermined aperture in an insulating protective film 5. Here, 40 connecting pads 4 exposed in windows each having an aperture of 80 μm are disposed at 200 μm pitch along the periphery of the substrate 1 and alternately in two rows. The material of the connecting pads 4 is gold.

On each connecting pad 4, an underlying electrode 6 is formed by vapor deposition, a nickel (Ni) layer 3 for suppressing interdiffusion between the vapor-deposited layers of the underlying electrodes 6 and the metal of solder bumps 2 is formed by plating on the underlying electrode 6, and the solder bump 2 of SnAg composition is formed by plating on the Ni layer 3.

Each of the solder bumps 2 has a plate-like shape with a triangular upper surface, and extends by 25 μm in three directions perpendicular to each side of the underlying electrode 6 along the film surface of the insulating protective film 5. The length of one side of the solder bump is 150 μm and the height is 30 μm.

In the sixth embodiment, since a plurality of solder bumps 2 having narrowed array pitch as a whole are provided by disposing the solder bumps 2 in two rows so that an apex 2a of the solder bump 2 in one row is positioned between both apexes 2a of the two adjoining solder bumps 2 in the other row, the distance between the solder bumps 2 can be narrowed compared to the case where the solder bumps 2 are linearly disposed in a row.

Therefore, the number of solder bumps formed in a semiconductor element can be increased about 1.7 times, and the number of input-output terminals can be significantly increased. Also in the same manner as the previously described embodiments, by the solder height increasing effect during reflowing, the equivalent effect of significantly reducing defective soldering in mounting to a mounting board 7 can be obtained.

Seventh Embodiment

Figure 9:
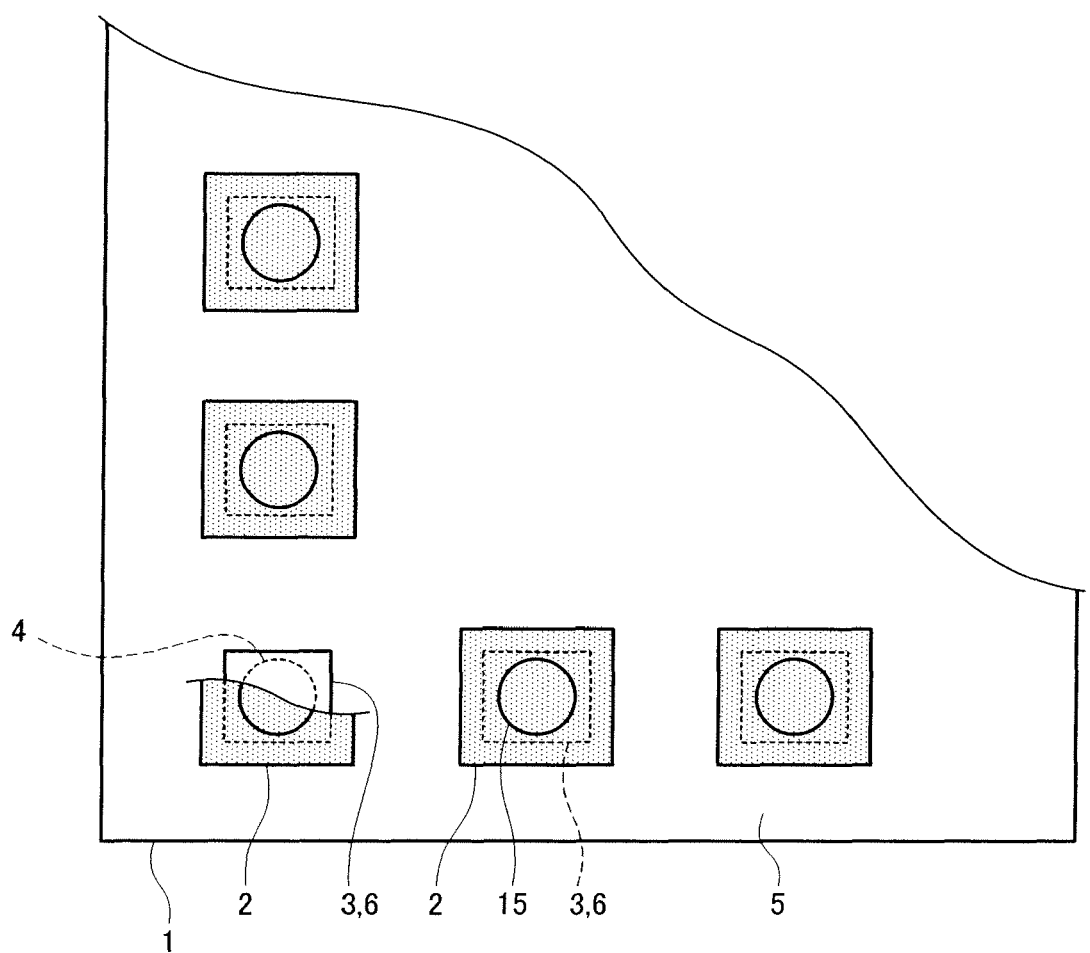
FIG. 9 is a plan view showing the configuration of a semiconductor device according to a seventh embodiment of the present invention.

FIG. 9 is a plan view showing a semiconductor device according to the seventh embodiment of the present invention. In FIG. 9, the size of an antenna switch element composing the semiconductor device is 2 mm long and 2 mm wide; and the total thickness including the height of a solder bump is 0.3 mm. A substrate 1 is a GaAs wafer and on the surface layer of the wafer, an antenna switch circuit pattern is formed.

The thickness of the substrate 1 is 0.2 mm, a plurality of connecting pads 4 and a thin insulating protective film 5 are formed on the surface layer of the wafer in the substrate 1, and the connecting pads 4 are exposed in windows having a predetermined aperture in the insulating protective film 5. Here, 56 connecting pads 4 exposed in windows each having an aperture of 80 μm are formed at 250 μm pitch along the periphery of the substrate 1. The material of the connecting pads 4 is gold.

On each connecting pad 4, an underlying electrode 6 is formed by vapor deposition, a nickel (Ni) layer 3 having the same size for suppressing interdiffusion between the vapor-deposited layers of the underlying electrodes 6 and the metal of solder bumps 2 is formed by plating and the solder bump 2 of SnAg composition is formed by plating on the Ni layer 3.

Each of the solder bumps 2 has a plate-like shape with a square upper surface, and extends by 25 μm in four directions perpendicular to each side of the underlying electrode 6 along the film surface of the insulating protective film 5. The length and the height of each solder bump is 150 μm and 30 μm, respectively.

In the seventh embodiment, a mortar-shaped dent 15 having a diameter of 80 μm is formed in a region corresponding to the underlying electrode 6 on the surface of each solder bump 2, and the quantity of solder can be delicately adjusted by using the dent 15 on the surface. Furthermore, when the electrical test of the antenna switch element is conducted, a probe having a spherical tip can be inserted into the dent 15, and the test of the solder bumps 2 can be stably conducted. Also in the same manner as the previously described embodiments, by the solder height increasing effect during reflowing, the equivalent effect of significantly reducing defective soldering in mounting to a mounting board 7 can be obtained.

Although the embodiments of the present invention have been described referring to specific examples, the present invention is not limited to the specific examples in each of such embodiments.

Specifically, if solder protruded electrodes have a plate-like shape extending from an underlying electrode along an insulating protective film, and functions to suppress the poor connection between the solder protruded electrodes and the receiving land of a mounting board can be fulfilled when the solder protruded electrodes are spherically deformed on the underlying electrode while solder is melted by reflow heating, and the bump height is increased to at least the tolerance for the height of the solder protruded electrodes before reflowing, any semiconductor devices and methods of manufacturing the same belong to the scope of the present invention.

Since the semiconductor device and the method of manufacturing the same according to the present invention suppress the poor connection between the solder protruded electrodes and the receiving land of the mounting board caused by the variation of the height of bumps, can be applied to a narrow array pitch, and can freely adjust the height of bumps, the present invention is useful for semiconductor devices in which electrodes for connection to external devices are formed on one of a silicon substrate and a gallium arsenide substrate using solder protruded electrodes.

What is claimed is:

1. A method of manufacturing a semiconductor device comprising the steps of:
   forming a circuit pattern on a semiconductor substrate;
   forming an insulating protective film on the circuit pattern;
   forming underlying electrodes connected to the circuit pattern in an opening of the insulating protective film; and
   forming solder protruded electrodes on the underlying electrodes, wherein
   the solder protruded electrodes are formed in a plate-like shape having a predetermined thickness and in a region extended from the underlying electrodes along the insulating protective film so as to contain a predetermined quantity of solder, and the predetermined quantity of the solder is a quantity required to increase a height of each of the solder protruded electrodes that are spherically deformed on the underlying electrodes when the solder is melted by reflow heating to at least a tolerance for the height of each of the solder protruded electrodes before reflowing.

2. The method of manufacturing a semiconductor device according to claim 1, wherein when the solder protruded electrodes are formed on the underlying electrodes, a first resist film is formed so as to expose all the underlying electrodes on a same surface, a second resist film having openings each larger than one of the underlying electrodes on the first resist film, the solder protruded electrodes are formed by plating in the opening of the second resist film, and thereafter, the first and second resist films are removed to form the solder protruded electrodes extended from the underlying electrodes along the insulating protective film.

3. The method of manufacturing a semiconductor device according to claim 1, wherein when the solder protruded electrodes are formed on the underlying electrodes, a vapor-deposited amphoteric metal layer is formed in a peripheral region of the underlying electrodes so as to expose the underlying electrodes, a resist film having an opening larger than the underlying electrodes is formed thereon, the solder protruded electrodes are formed in the opening of the resist film by plating, thereafter, the resist film is removed, and the vapor-deposited amphoteric metal layer is removed using an alkaline chemical solution to form the solder protruded electrodes extended from the underlying electrodes along the insulating protective film.

4. A semiconductor device comprising:
a circuit pattern formed on a semiconductor substrate;
an insulating protective film formed on the circuit pattern;
underlying electrodes connected to the circuit pattern formed in an opening of the insulating protective film; and
solder protruded electrodes formed on the underlying electrodes, wherein
the solder protruded electrodes have a plate-like shape of a predetermined thickness extending from the underlying electrodes onto the insulating protective film, and an area of each of the solder protruded electrodes is wider than an area of each of the underlying electrodes wherein each of the solder protruded electrodes contains a predetermined quantity of solder in a region extending from the underlying electrodes along the insulating protective film, and the predetermined quantity of the solder is a quantity required so that a height of each of the solder protruded electrodes after reflowing increases to at least a tolerance for the height of each of the solder protruded electrodes before reflowing.

5. The semiconductor device according to claim 4, wherein each of the solder protruded electrodes has a plate-like shape that satisfies:

$$(Sb-Sm)/Sm > \Delta Hb/Hb$$

where $Sb$ is the area, $Hb$ is a thickness, and $\Delta Hb$ is a variation width of a height of each of the solder protruded electrodes; and $Sm$ is the area of each of the underlying electrodes.

6. The semiconductor device according to claim 4, wherein each of the solder protruded electrodes has a plate-like shape whose upper surface is one of triangular, rectangular and elliptical, extending toward at least one direction along the insulating protective film.

7. The semiconductor device according to claim 4, having the plurality of solder protruded electrodes arrayed in line, wherein each of the solder protruded electrodes has a plate-like shape whose upper surface is rectangular, not extending toward a direction facing the adjacent solder protruded electrodes and having a same width as a width of each of the underlying electrodes, and extending toward a direction perpendicular to an array direction of the solder protruded electrodes along the insulating protective film.

8. The semiconductor device according to claim 4, having the plurality of solder protruded electrodes arrayed in two lines, wherein each of the solder protruded electrodes has a plate-like shape whose upper surface is triangular, and between adjoining apexes of the solder protruded electrodes in one of the lines, an apex of the one solder protruded electrode in the other line is positioned.

9. The semiconductor device according to claim 4, wherein each of the solder protruded electrodes has a plate-like shape whose upper surface is rectangular, and has a dent in a corresponding region on each of the underlying electrodes on the upper surface.

10. The semiconductor device according to claim 4, wherein the semiconductor substrate is composed of one of silicon and gallium arsenide.

* * * * *